(12) United States Patent
Matsuki et al.

(10) Patent No.: US 7,095,170 B2
(45) Date of Patent: Aug. 22, 2006

(54) METHOD OF MANUFACTURING AN ORGANIC ELECTROLUMINESCENT DEVICE AND RESULTING DEVICE

(75) Inventors: Hiroshi Matsuki, Gifu (JP); Yoshitaka Nishio, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/378,611

(22) Filed: Mar. 5, 2003

(65) Prior Publication Data

US 2003/0168974 A1    Sep. 11, 2003

(30) Foreign Application Priority Data

Mar. 5, 2002    (JP)    ............................. 2002-059587

(51) Int. Cl.
    *H05B 33/00* (2006.01)
(52) U.S. Cl. ........................................ 313/506; 445/23
(58) Field of Classification Search ........ 313/504–506; 445/23–25; 428/690, 917
    See application file for complete search history.

(56) References Cited

U.S. PATENT DOCUMENTS 6,572,985 B1 *    6/2003    Xie ............................ 428/690

FOREIGN PATENT DOCUMENTS

| EP | 0 892 587 A2 | 1/1999 |
| JP | 8-306488 | 11/1996 |
| JP | 11-121172 | 4/1999 |
| JP | 11-195485 | 7/1999 |
| JP | 11-288786 | 10/1999 |
| JP | 2001-167886 A | 6/2001 |

OTHER PUBLICATIONS

Chinese Office Action for Application No. 03120229.2 Date of Dispatch: Aug. 26, 2005 Applicant: Sanyo Electric Co., Ltd.

* cited by examiner

*Primary Examiner*—Joseph Williams

(57) ABSTRACT

An organic EL device is fabricated by a novel method to reduce the occurrence of poor luminescence in the organic EL device. An anode layer, a hole transporting layer, a luminescent layer, an electron transporting layer, and a cathode layer are laminated in this order on a substrate to form an organic EL device. In the organic EL device, the hole transporting layer is increased in thickness so that foreign particles adhering on the anode layer are substantially covered with the hole transporting layer.

2 Claims, 13 Drawing Sheets

DEAD PIXELS IN ORGANIC EL PANEL
( MARKED WITH "·" )

FIG. 6

| LOT NUMBER | THICKNESS | DEAD PIXELS |
|---|---|---|
| A01 | 1300 | 11.0 |
|  | 1300 | 14.3 |
|  | 1300 | 7.4 |
| A02 | 1500 | 8.7 |
|  | 1500 | 11.0 |
|  | 1500 | 5.3 |
| A03 | 1400 | 8.8 |
|  | 1400 | 11.4 |
| A04 | 1100 | 14.1 |
|  | 1100 | 18.1 |
|  | 1100 | 9.3 |
|  | 1100 | 10.9 |
| A05 | 1700 | 5.3 |
|  | 1700 | 5.9 |
|  | 1700 | 5.3 |
| A06 | 1400 | 10.2 |
|  | 1400 | 9.3 |
| A07 | 1700 | 9.8 |
|  | 1700 | 2.3 |
|  | 1700 | 7.5 |
|  | 1700 | 1.4 |
| A08 | 2400 | 3.5 |
|  | 2400 | 5.1 |

METHOD OF MANUFACTURING AN ORGANIC ELECTROLUMINESCENT DEVICE AND RESULTING DEVICE

BACKGROUND OF THE INVENTION

1. Field of the Invention

The present invention relates to an organic electroluminescent device and a method of manufacturing the organic electroluminescent device, and more particularly to a technology for solving a problem of a defect of luminescence in an organic electroluminescent device.

2. Description of the Related Art

Organic electroluminescent displays (hereinafter, also referred to as "organic EL displays" or "organic EL panels") are attracting attention as new flat-type displays. In particular, active matrix type organic EL displays having thin film transistors (hereinafter, also referred to as "TFTs") as switching elements are regarded as sweeping out the currently prevailing liquid crystal displays in the near future, and are in a fierce development race for practical application.

FIG. 1 schematically shows the sectional structure of a typical organic electroluminescent device (hereinafter, also referred to as "organic EL device"). The organic EL device 100 has the structure in which an anode layer 20, an organic luminescent element layer 80, and a cathode layer 60 are laminated on a substrate 10 in order. The organic luminescent element layer 80 includes organic layers which function as a luminescent element such as a hole transporting layer 30, a luminescent layer 40, and an electron transporting layer 50, which are laminated on the anode layer 20 in this order. When a voltage is applied across the anode layer 20 and the cathode layer 60, holes injected from the anode layer 20 are transported to the luminescent layer 40 by the hole transporting layer 30. Electrons injected from the cathode layer 60 are transported to the luminescent layer 40 by the electron transporting layer 50. The electrons and the holes are recombined with each other at the interface or inside of the luminescent layer 40. The resulting energy excites electrons in the organic molecules of the luminescent layer 40. Then, the excited electrons relax with fluorescence emission. At least either one of the anode layer 20 and the cathode layer 60 is made of a transparent or semi-transparent material that transmits light of visible light range. The light emitted from the luminescent layer 40 is taken out through the electrode layer.

As above, unlike liquid crystal displays, organic EL displays have self-emission devices. This eliminates the need for a backlight which is indispensable to liquid crystal displays, promising apparatuses of yet lower profile and lighter weight. When poor luminescence occurs for any reason, however, dead pixels appear on-screen with deterioration in screen visibility, sometimes presenting an obstacle to the display function. It has therefore been a significant challenge to ascertain the cause of the poor luminescence and prevent it effectively so that organic EL displays having fewer dead pixels or no dead pixel can be fabricated with high yield.

SUMMARY OF THE INVENTION

The present invention has been made in view of the foregoing circumstances and an object thereof is to provide a technology for reducing the occurrences of poor luminescence in an organic EL device.

A preferred embodiment according to the present invention relates to a method of manufacturing an organic electroluminescent device. This method is one for manufacturing an organic electroluminescent device by depositing an organic layer on a substrate. The organic layer is deposited so as to cover foreign particles adhering to the surface of the substrate substantially. The organic layer may include deposited layers of organic-containing materials, such as a luminescent layer, a hole transporting layer, and an electron transporting layer. Since the foreign particles are substantially covered with the organic layer, it is possible to avoid a short between the anode and the cathode, thereby reducing poor luminescence. All the adhering foreign particles are preferably covered with the organic layer, whereas not all the adhering foreign particles necessarily cause an interelectrode short. For example, in the case of an organic EL panel having a plurality of organic EL devices, foreign particles need only be covered such that an upper limit to the number of dead pixels in a panel for products to satisfy, if specified, is not exceeded. It is essential only that the organic layer is deposited to such a thickness as is expected sufficient to reduce the number of occurrences of poor luminescence ascribable to interelectrode shorts to the allowable range.

The organic layer may be deposited to a thickness that is determined by acquiring the particle size distribution of foreign particles lying in a system for depositing the organic layer. Foreign particles can vary in type and particle size distribution from one system to another. For example, at the start of use of a new system, the sizes of the foreign particles remaining in the system may thus be measured to determine a thickness of the organic layer such as is expected sufficient to cover those foreign particles. The thickness of the organic layer may also be determined by measuring the sizes of foreign particles each time the system is used. A sensor for measuring the number or sizes of foreign particles may be provided in the system so that the thickness of the organic layer is controlled in real time. The thickness of the organic layer may be determined by measuring manufactured organic EL panels for the number of dead pixels. The thickness of the organic layer may also be determined in such a manner that: the surface of a substrate having the organic layer deposited thereon is observed to examine if foreign particles are covered sufficiently; and when the foreign particles are not covered sufficiently, the thickness of the organic layer is increased further.

The organic layer may include a hole transporting layer interposed between an anode layer arranged on the substrate and a luminescent layer. Here, the hole transporting layer is deposited to cover foreign particles adhering on the anode layer, and the luminescent layer is deposited thereon. Covering the foreign particles with the layer lying below the luminescent layer can avoid an interelectrode short. The hole transporting layer is desirably 1300 angstroms or above, and preferably 1700 angstroms or above, in thickness.

Another preferred embodiment according to the present invention relates to an organic electroluminescent device. This organic electroluminescent device comprises an organic layer interposed between a pair of electrode layers. The organic layer includes at least a luminescent layer, and has a thickness of 1300 angstroms or above. Yet preferably, the organic layer may be 1700 angstroms or above in thickness. Consequently, foreign particles adhering to the surface of the substrate can be covered with the organic layer substantially to avoid an interelectrode short.

It is to be noted that any arbitrary combination or recombination of the above-described structural components and expressions changed between a method, an apparatus, a system and so forth are all effective as and encompassed by the present embodiments.

Moreover, this summary of the invention does not necessarily describe all necessary features, so that the invention may also be sub-combination of these described features.

BRIEF DESCRIPTION OF THE DRAWINGS

FIG. 6 is a chart showing measurements of the numbers of dead pixels in a plurality of organic EL panels having hole transporting layers of different thicknesses.

DETAILED DESCRIPTION OF THE PREFERRED EMBODIMENTS

The invention will now be described based on preferred embodiments which do not intend to limit the scope of the present invention but exemplify the invention. All of the features and the combinations thereof described in the embodiment are not necessarily essential to the invention.

In the methods of manufacturing an organic EL device according to embodiments, an organic layer is deposited thicker. Thus, even if foreign particles adhere to the surface of a substrate during the deposition of the organic layer such as a luminescent layer, the organic layer substantially covers the foreign particles to avoid electric contact between the electrodes.

Figure 1:
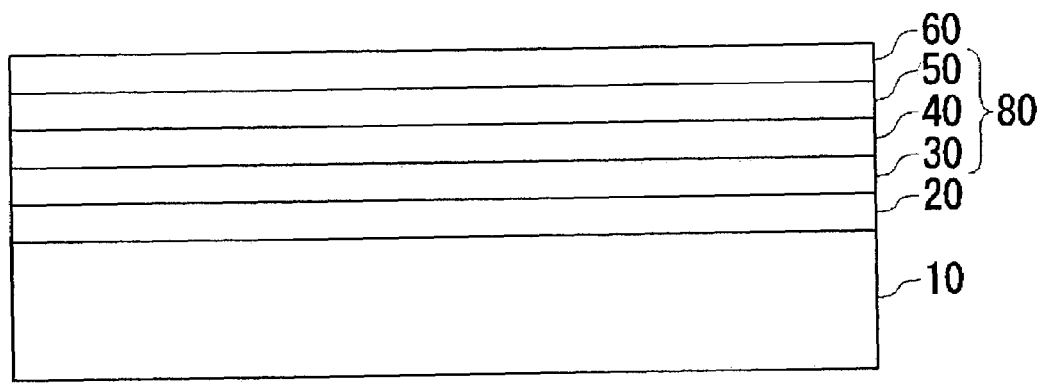
FIG. 1 is a diagram schematically showing the sectional structure of a typical organic EL device.
Figure 2:
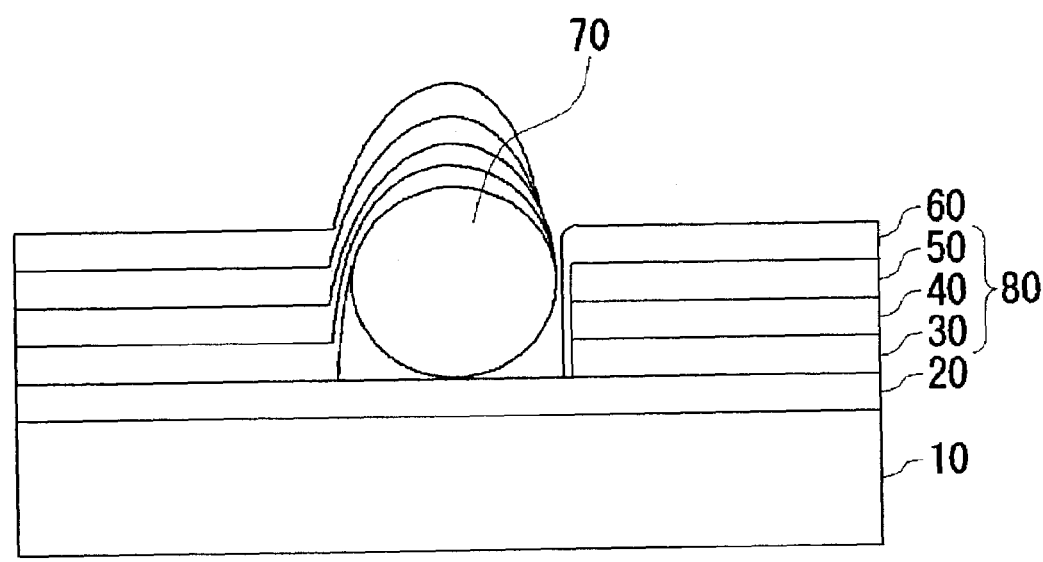
FIG. 2 is a diagram schematically showing the sectional structure of an organic EL device for situations where a foreign particle adheres to the surface in the process of fabrication.

FIG. 2 schematically shows the sectional structure of an organic EL device for situations where a foreign particle adheres to the surface in the process of fabrication. Incidentally, the diagram is intended only to give plain schematic representation of the adherence of a foreign particle, not to show the relationship between the actual thicknesses of the substrate, individual electrode layers, and organic layers, and the size of the foreign particle. An anode layer 20 is laminated on a substrate 10. The substrate is then introduced into a system for evaporating organic layers, at which time a foreign particle 70 remaining inside the system can adhere to the surface of the anode layer 20. When an organic luminescent element layer 80 is evaporated on the anode layer 20 with the foreign particle 70 adhering thereon, the organic substance is less evaporated on the area beneath the foreign particle 70 and on the periphery thereof. The organic luminescent element layer 80 may thus fail to cover the foreign particle 70, possibly leaving a gap around the foreign particle 70. A cathode layer 60 is then laminated on the organic luminescent element layer 80. Here, if the cathode material gets into the gap, the anode layer 20 and the cathode layer 60 can make contact at that portion and cause a short.

With the anode layer 20 and the cathode layer 60 shorted, an intensive current flows through the shorted portion when a voltage is applied between the anode layer 20 and the cathode layer 60. This precludes a current flow in the luminescent layer 40, resulting in a non-luminescent pixel where no luminescence occurs across the entire pixel. Organic EL panels containing a number of organic EL devices having such defects can no longer be shipped as products. This means a lower yield.

FIRST EMBODIMENT

Figure 3:
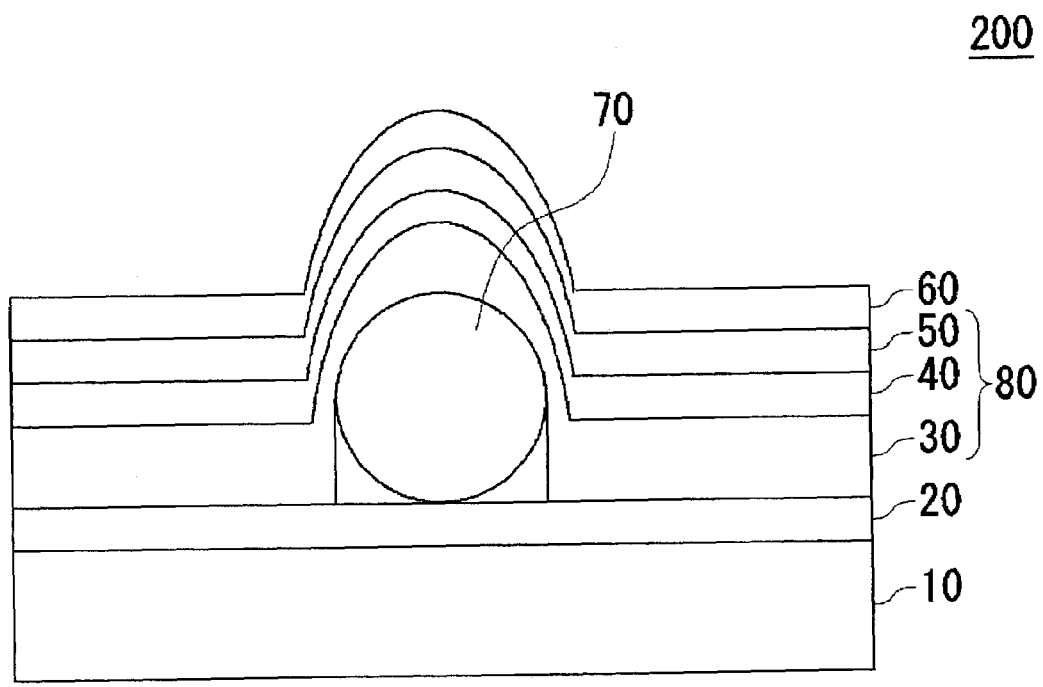
FIG. 3 is a diagram schematically showing the sectional structure of an organic EL device according to a first embodiment.

FIG. 3 schematically shows the sectional structure of an organic EL device according to a first embodiment of the present invention. In the present embodiment, the hole transporting layer 30 is increased in thickness so that the foreign particle 70 is substantially covered with the hole transporting layer 30.

A substrate 10 is made of an insulative substance such as glass. In the case of an active matrix type organic EL panel, for example, the substrate 10 has the structure in which driving circuits containing switching elements such as TFTs are formed on an insulative substrate, and a planarization film and the like are formed thereon. As employed in this specification, the substrate 10 shall also include such configuration as the driving circuits.

An anode layer 20 is formed on the substrate 10. The anode layer 20 is made of such material as indium tin oxide (ITO), tin oxide ($SnO_2$), or indium oxide ($In_2O_3$). ITO is typically used because of its hole injection efficiency and low surface resistance. Since ITO has high transparency to visible light, light emitted from a luminescent layer 40 is taken out through the ITO anode layer 20. An additional planarization film may be deposited on the anode layer 20 if necessary.

An organic luminescent element layer 80 including the hole transporting layer 30, the luminescent layer 40, and an electron transporting layer 50 is formed on the anode layer 20. In general, these organic layers are formed by vacuum evaporation in a multi-chamber type fabrication system having a plurality of formation chambers. Before the substrate is introduced into the system, the surface of the substrate undergoes cleaning, yet unremoved foreign particles may remain on the surface. In addition, such matter as inorganic or organic substances having peeled off the organic EL devices fabricated last time and organic substances not evaporated onto substrates may remain and adhere to the surface of the substrate introduced newly. Effective prevention of electric contact between the electrodes ascribable to adhering foreign particles requires only that an organic layer be deposited to a thickness such that the foreign particles are covered substantially.

The hole transporting layer 30 is made of such material as N,N'-di(naphthalene-1-yl)-N,N'-diphenyl-benzidine (hereinafter, referred to as "material 1"), 4,4',4''-tris(3-methylphenylphenylamino)triphenylamine (MTDATA), or N,N'-diphenyl-N,N'-di(3-methylphenyl)-1,1'-biphenyl-4,4'-diamine. The luminescent layer 40 is made of such material as aluminum-quinoline complex ($Alq_3$) or bis (10-hydroxybenzo[h]quinolinato) beryllium ($Bebq_2$) containing a quinarcridon derivative. The electron transporting layer 50 is made of such material as $Alq_3$ or $Bebq_2$.

A cathode layer 60 is formed on the electron transporting layer 50. The cathode layer 60 is made of such material as an aluminum alloy containing a trace quantity of lithium, a magnesium indium alloy, or a magnesium silver alloy. The cathode layer 60 may have a double-layer structure having a lithium fluoride (LiF) layer and an aluminum (Al) layer in this order from the electron transporting layer 50.

In the present embodiment, the hole transporting layer 30 covers the foreign particle 70 as shown in FIG. 3. Consequently, electric contact between the anode layer 20 and the cathode layer 60 can be prevented for effective prevention of poor luminescence across the entire pixel ascribable to a short. Moreover, since the hole transporting layer 30 lying between the anode layer 20 and the luminescent layer 40 covers the foreign particle 70, it is possible to prevent the material of the luminescent layer 40, an organic substance, from poor evaporation so that the luminescent layer 40 can be evaporated evenly with no gap. Poor luminescence around the foreign particle 70 can thus be avoided effectively.

Figure 4:
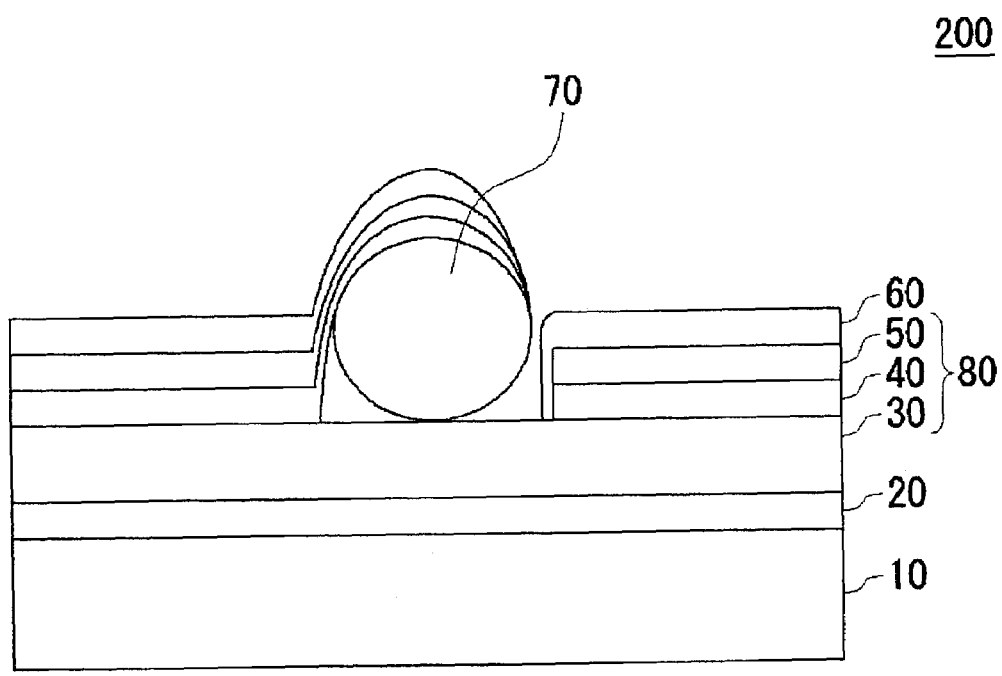
FIG. 4 is a diagram schematically showing the sectional structure of the organic EL device according to the first embodiment for situations where a foreign particle adheres to the top surface of the hole transporting layer in the process of fabrication.

FIG. 4 schematically shows the sectional structure of the organic EL device according to the present embodiment for situations where a foreign particle adheres to the top surface of the hole transporting layer in the process of fabrication. In FIG. 4, the foreign particle 70 adheres onto the hole transporting layer 30. The luminescent layer 40 and the electron transporting layer 50 are not evaporated on the periphery of the foreign particle 70, and the cathode layer 60 gets into the gap. Here, if the hole transporting layer 30 were thin, the anode layer 20 and the cathode layer 60 could short out to preclude a current flow in the luminescent layer 40, making the entire pixel a dead pixel. In the organic EL device 200 of the present embodiment, the increased thickness of the hole transporting layer 30 can prevent a short between the anode layer 20 and the cathode layer 60.

Figure 5A:
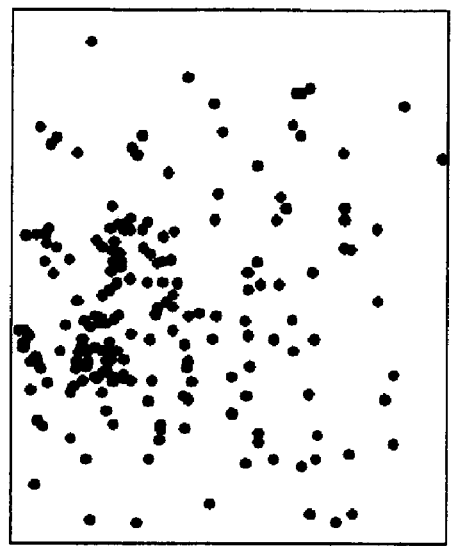
FIGS. 5A and 5B are diagrams showing the distributions of dead pixels in organic EL panels.
Figure 5A:
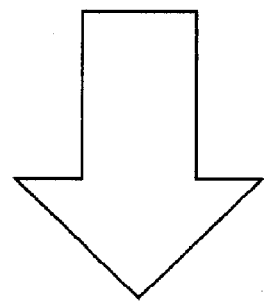
Figure 5B:
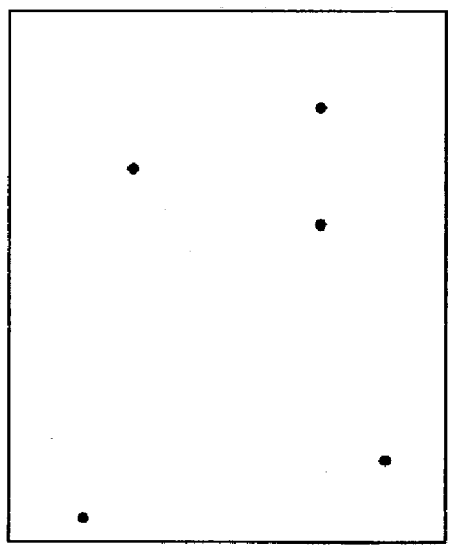

FIGS. 5A and 5B are diagrams showing the distributions of dead pixels in organic EL panels. The distributions of dead pixels were measured by checking the organic EL panels visually under a microscope or the like. FIG. 5A shows the distribution of dead pixels in an organic EL panel that is composed of organic EL devices having the thin organic layer shown in FIG. 2. This organic EL panel has too many dead pixels to function in order as a display. FIG. 5B shows the distribution of dead pixels in an organic EL panel that is composed of organic EL devices having the thick organic layer shown in FIG. 3. The number of dead pixels in this organic EL panel is significantly smaller than the number of dead pixels in the organic EL panel shown in FIG. 5A. It is apparent that thickening the organic layer can reduce the occurrence of dead pixels greatly.

FIG. 6 shows measurements of the numbers of dead pixels in a plurality of organic EL panels having hole transporting layers 30 of different thicknesses. A plurality of organic EL panels having the hole transporting layers made of the diamine derivative specified with material 1 were fabricated and measured for the number of dead pixels.

Figure 7:
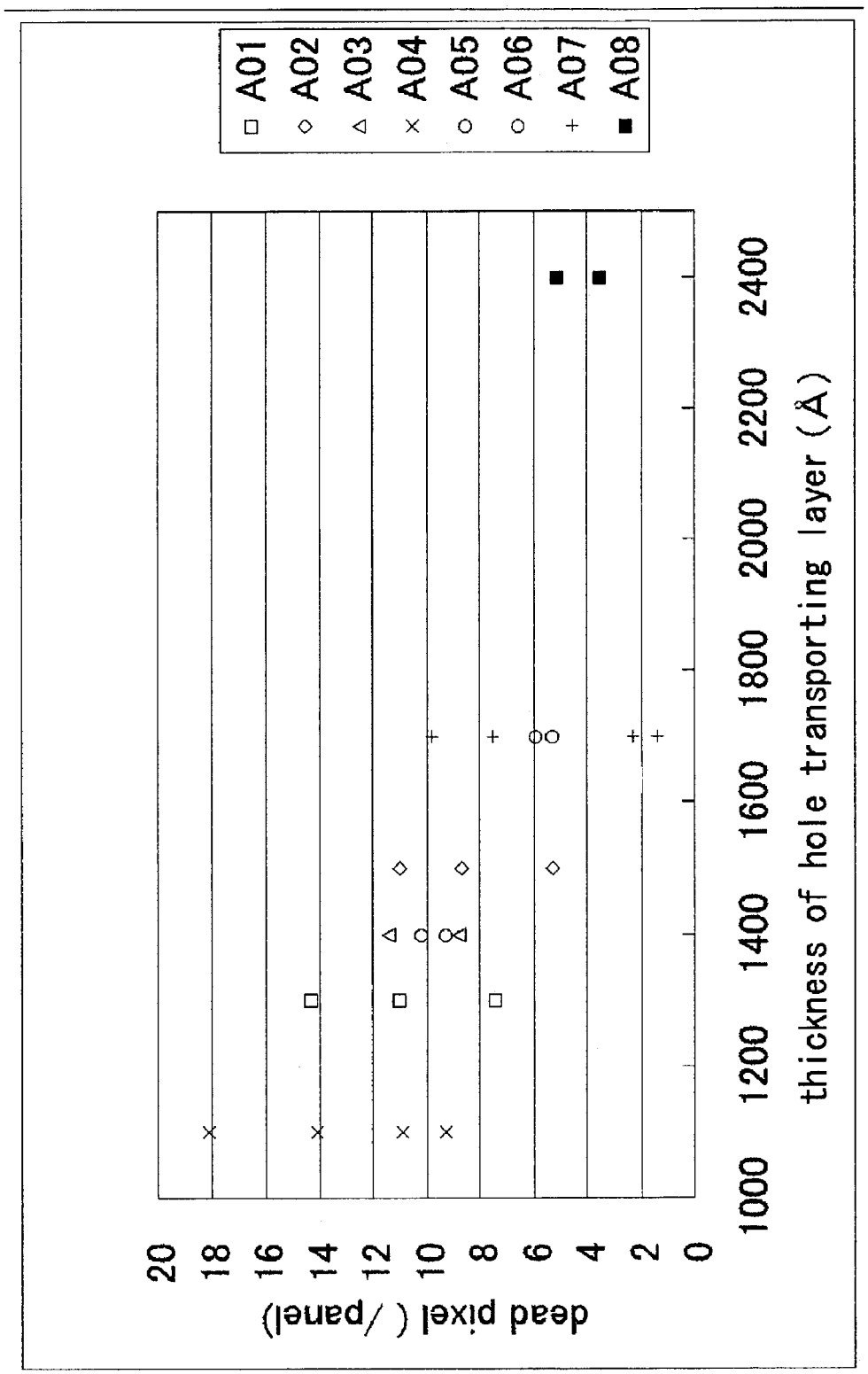
FIG. 7 is a graphic representation of the measurements shown in FIG. 6, showing the relationship between the thickness of the hole transporting layer and the number of dead pixels.

FIG. 7 is a graphic representation of the measurements shown in FIG. 6, showing the relationship between the thickness of the hole transporting layer and the number of dead pixels. The organic EL panels of 1100 angstroms in thickness included one which exceeded 18 in the number of dead pixels and thus was inappropriate for a product. It can be seen that a thickness of 1300 angstroms reduced the number of dead pixels for an improved yield. Yet the greater the thickness, the smaller the number of dead pixels accordingly. The organic EL panels of 1700 angstroms in thickness decreased in the number of dead pixels to the same level as with a thickness of 2400 angstroms. Possible causes of a dead pixel may include other than an interelectrode short. Thus, at thicknesses of 1700 angstroms and above, the occurrence of dead pixels ascribable to interelectrode shorts is considered to be reduced sufficiently. According to the foregoing results, the hole transporting layer 30 is desirably given a thickness of 1300 angstroms or above, and preferably 1700 angstroms or above. The upper limit to the thickness of the hole transporting layer 30 need only be designed not to have much effect on the characteristics of the organic EL device. For example, it may be 5000 angstroms or less, and preferably 4000 angstroms or less.

Foreign particles remaining in the system for depositing the organic layer may vary in particle size distribution from one system to another. In the example shown in FIGS. 6 and 7, it is known that many of the foreign particles in the system have particle sizes of 3000 angstroms or so. This shows that the hole transporting layer 30 better has a thickness at least half or so the particle sizes of the foreign particles. Along these lines, the particle size distribution of the foreign particles lying in the system for depositing the organic layer may be acquired in advance so that the thickness of the organic layer is determined from the same. For example, at the start of use of a new system, the sizes of foreign particles remaining in the system may be measured to determine the thickness of the organic layer such as is expected sufficient to cover those foreign particles. Alternatively, the sizes of foreign particles may be measured to determine the thickness of the organic layer each time the system is used. This makes it possible to determine an appropriate thickness system by system. Consequently, foreign particles can be surely covered with the organic layer to prevent an interelectrode short. A sensor for measuring the number or sizes of foreign particles may be provided in the system so that the thickness of the organic layer is controlled in real time. The thickness of the organic layer may be determined by measuring the number of dead pixels in organic EL panels fabricated. The thickness of the organic layer may also be determined in such a manner that: the surface of a substrate having the organic layer deposited thereon is observed to examine if foreign particles are covered sufficiently, and when the foreign particles are not covered sufficiently, the thickness of the organic layer is increased further.

SECOND EMBODIMENT

Figure 8:
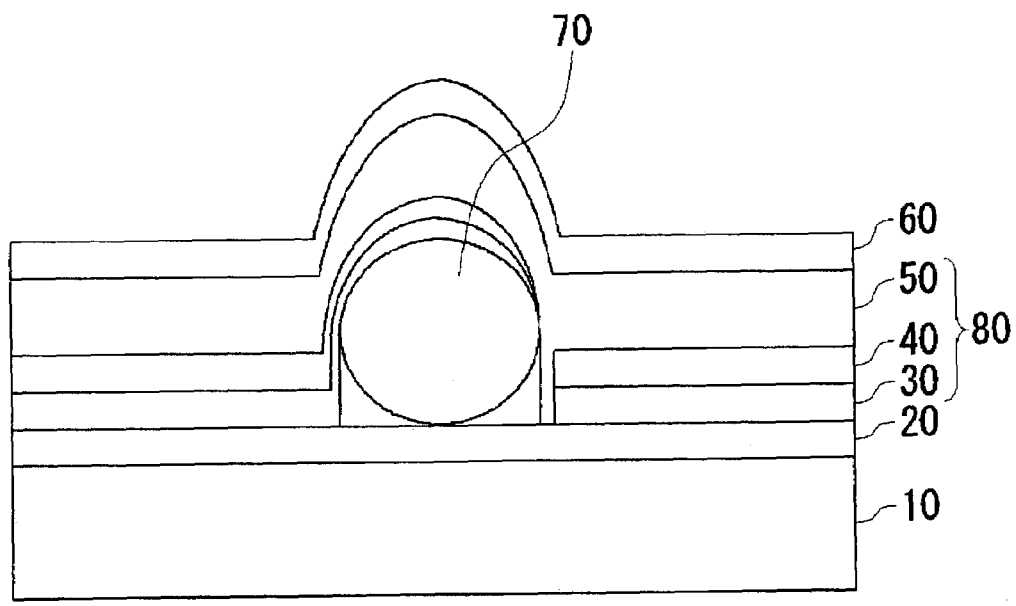
FIG. 8 is a diagram schematically showing the sectional structure of an organic EL device according to a second embodiment.

FIG. 8 schematically shows the sectional structure of an organic EL device according to a second embodiment. In the present embodiment, the electron transporting layer 50 is increased in thickness so that the foreign particle 70 is substantially covered with the electron transporting layer 50.

As shown in FIG. 8, even if the hole transporting layer 30 and the luminescent layer 40 fail to cover the foreign particle 70 adhering on the anode layer 20, the electron transporting layer 50 deposited thickly can substantially cover the foreign particle 70 to avoid electric contact between the anode and the cathode. Here, as with the thickness of the hole transporting layer 30 in the first embodiment, the thickness of the electron transporting layer 50 is desirably 1300 angstroms or above, and preferably 1700 angstroms or above. The upper limit to the thickness of the electron transporting layer 50 need only be designed not to have much effect on the characteristics of the organic EL device. For example, it may be 5000 angstroms or less, and preferably 4000 angstroms or less.

THIRD EMBODIMENT

Figure 9:
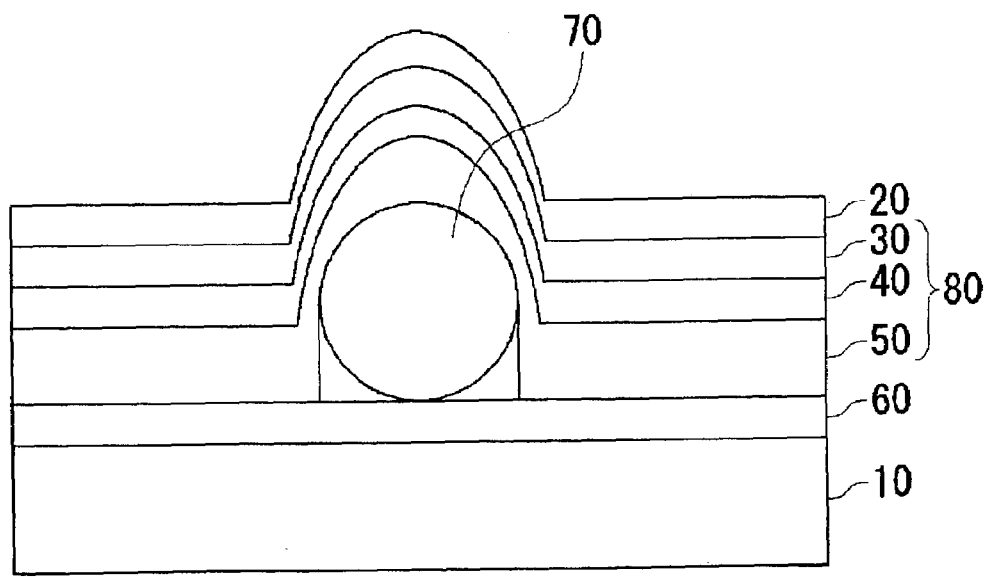
FIG. 9 is a diagram schematically showing the sectional structure of an organic EL device according to a third embodiment.

FIG. 9 schematically shows the sectional structure of an organic EL device according to a third embodiment. The organic EL device of the present embodiment has the electrode layers at positions opposite from in the organic EL devices of the first and second embodiments. The substrate 10 is covered with the cathode layer 60, on which the electron transporting layer 50, the luminescent layer 40, the hole transporting layer 30, and the anode layer 20 are laminated in this order. As shown in FIG. 9, the electron transporting layer 50 lying immediately above the cathode layer 60 can substantially cover the foreign particle 70 adhering on the cathode layer 60, thereby preventing an interelectrode short and avoiding poor evaporation of the luminescent layer 40.

Here, as with the thickness of the hole transporting layer 30 in the first embodiment, the thickness of the electron transporting layer 50 is desirably 1300 angstroms or above, and preferably 1700 angstroms or above. The upper limit to the thickness of the electron transporting layer 50 need only be designed not to have much effect on the characteristics of the organic EL device. For example, it may be 5000 angstroms or less, and preferably 4000 angstroms or less.

FOURTH EMBODIMENT

Figure 10:
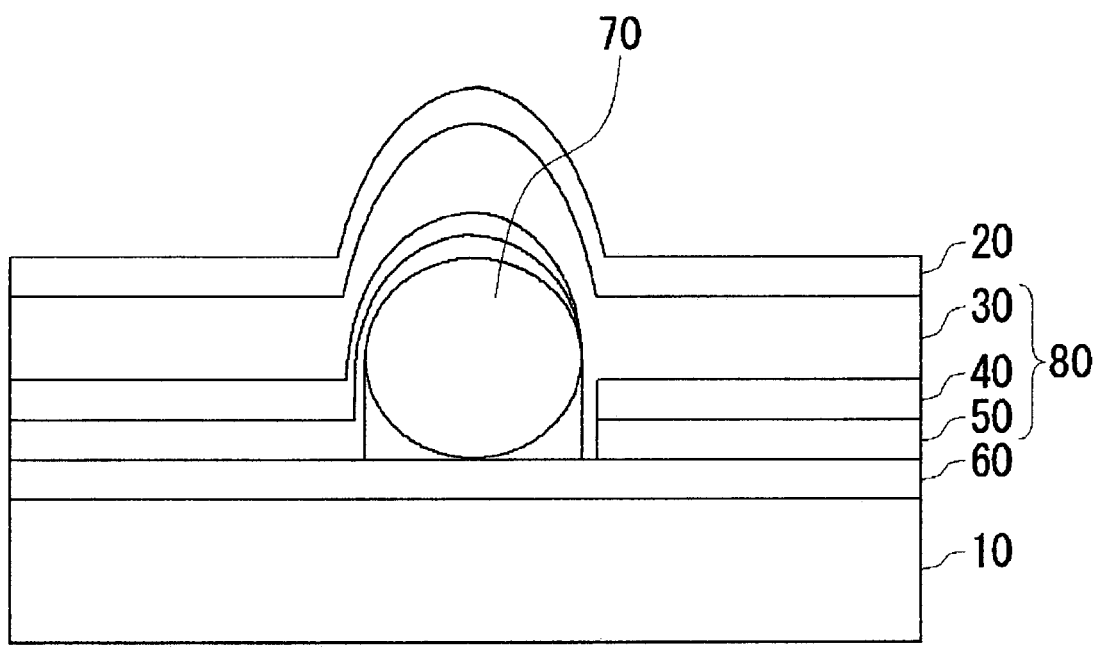
FIG. 10 is a diagram schematically showing the sectional structure of an organic EL device according to a fourth embodiment.

FIG. 10 schematically shows the sectional structure of an organic EL device according to a fourth embodiment. Unlike the organic EL device of the third embodiment, the organic EL device of the present embodiment is increased in the thickness of the hole transporting layer 30. As shown in FIG. 10, even if the electron transporting layer 50 and the luminescent layer 40 fail to cover the foreign particle 70 adhering on the cathode layer 60, the hole transporting layer 30 deposited thickly can substantially cover the foreign particle 70 to avoid electric contact between the anode and the cathode.

Here, as with the thickness of the hole transporting layer 30 in the first embodiment, the thickness of the hole transporting layer 30 is desirably 1300 angstroms or above, and preferably 1700 angstroms or above. The upper limit to the thickness of the hole transporting layer 30 need only be designed not to have much effect on the characteristics of the organic EL device. For example, it may be 5000 angstroms or less, and preferably 4000 angstroms or less. The hole transporting layer 30 has the advantage that it can be thickened with less effect on the characteristics of the organic EL device as compared to the other organic layers.

The thickness of the hole transporting layer 30 may be determined further taking account of a chromaticity or a luminous intensity of the organic EL panel. The chromaticity of primary colors is standardized by National Television System Committee (NTSC) as follows:

R: $CIE_x=0.67$, $CIE_y=0.33$
G: $CIE_x=0.21$, $CIE_y=0.71$
B: $CIE_x=0.14$, $CIE_y=0.08$

It is desirable that the thickness of the hole transporting layer 30 is controlled so that the chromaticity can approach to above standard value, since the chromaticity of the organic EL panel may vary with the thickness of the hole transporting layer 30. It is also desirable that the thickness is controlled so that the luminous intensity can be as highly as possible, since the luminous intensity of the organic EL panel vary with the thickness of the hole transporting layer 30. The desirable thickness of the hole transporting layer 30 is examined in the light of above mentioned views hereinafter. In FIG. 11 to FIG. 16, the example in which the hole transporting layer is made of the diamine derivative specified with material 1 is shown.

Figure 11:
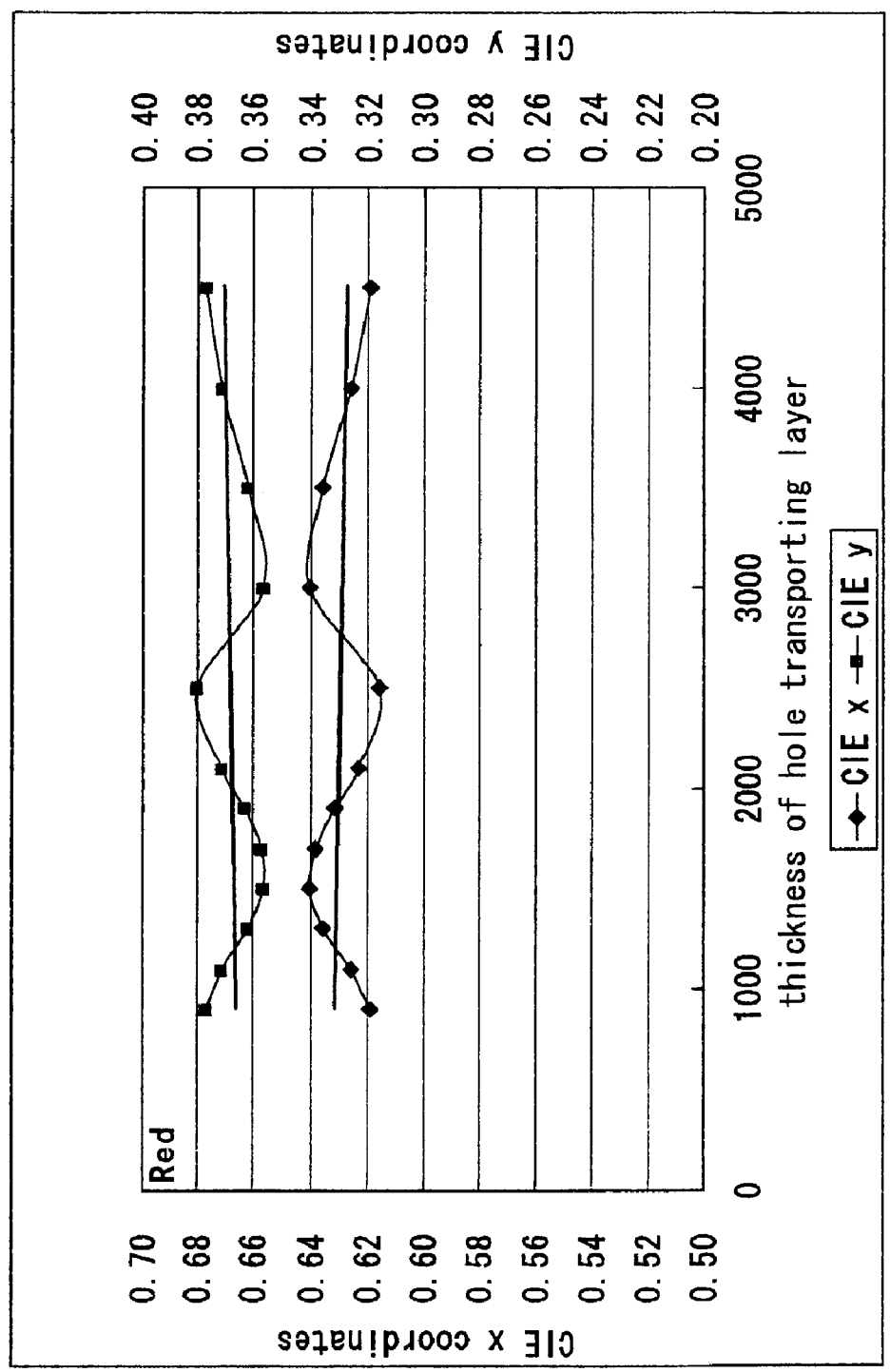
FIG. 11 is a graphic representation showing the relation between a red chromaticity and a thickness of a hole transporting layer of an organic EL device.

FIG. 11 is a graphic representation showing the relation between a red chromaticity and a thickness of a hole transporting layer 30 of an organic EL device. The curves show the thickness dependency of red $CIE_x$ and $CIE_y$, and the lines are least-square lines. As shown in FIG. 11, the ranges of the thickness where the chromaticity is closer to the standard value than least-square lines are 1200–2000 and 2800–3900 angstroms concerning $CIE_x$, 1200–2000 and 2800–3900 angstroms concerning $CIE_y$.

Figure 12:
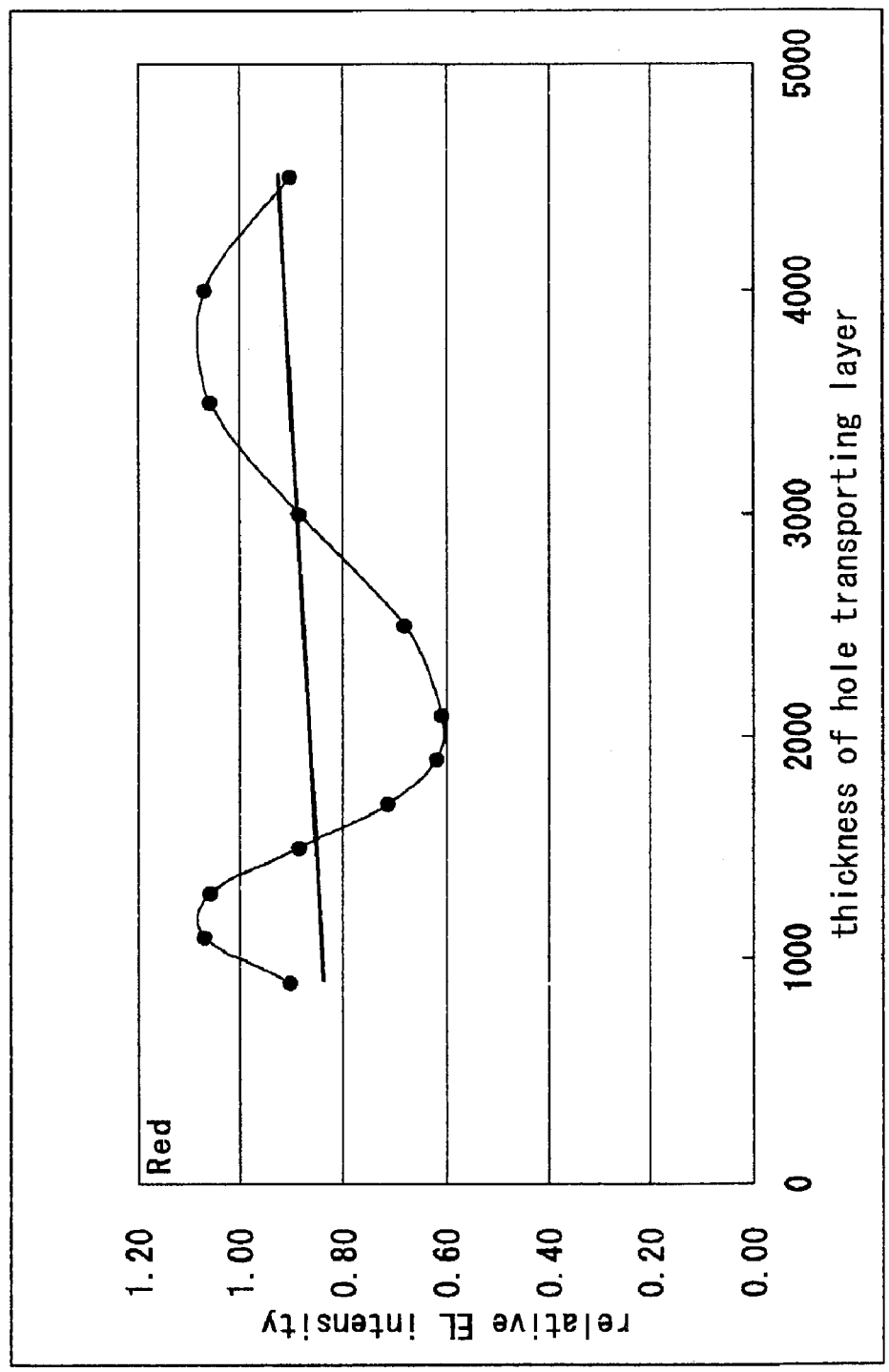
FIG. 12 is a graphic representation showing the relation between a relative intensity of a red light and a thickness of a hole transporting layer of an organic EL device.

FIG. 12 is a graphic representation showing the relation between a relative intensity of a red light and a thickness of a hole transporting layer 30 of an organic EL device. The curves show the thickness dependency of relative intensity of a red light, and the lines are least-square lines. As shown in FIG. 12, the ranges of the thickness where the intensity is higher than least-square lines are 700–1500 and 3000–4500 angstroms.

Figure 13:
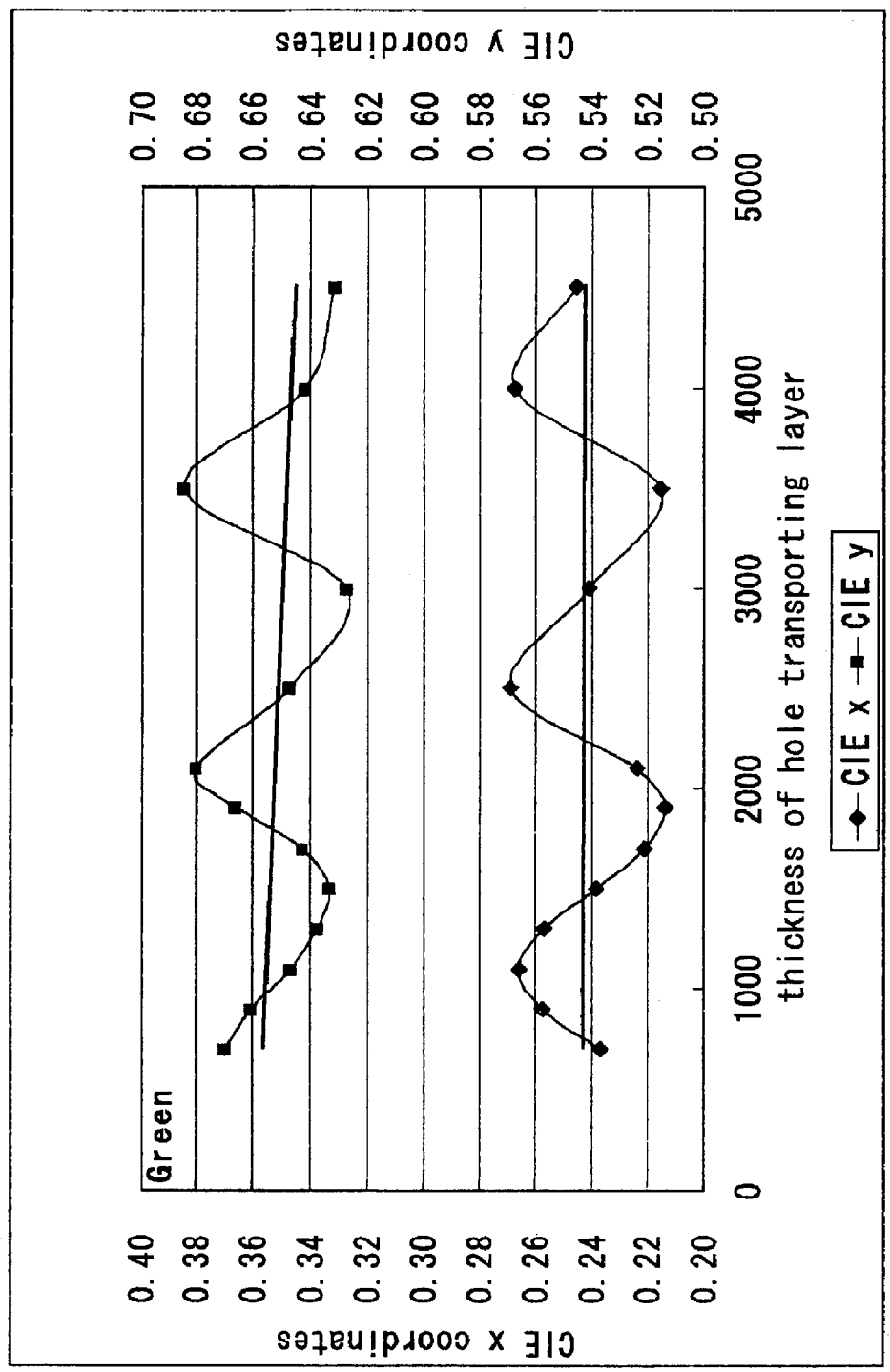
FIG. 13 is a graphic representation showing the relation between a green chromaticity and a thickness of a hole transporting layer of an organic EL device.

FIG. 13 is a graphic representation showing the relation between a green chromaticity and a thickness of a hole transporting layer 30 of an organic EL device. The curves show the thickness dependency of green $CIE_x$ and $CIE_y$, and the lines are least-square lines. As shown in FIG. 13, the ranges of the thickness where the chromaticity is closer to the standard value than least-square lines are 1400–2300 and 3000–3800 angstroms concerning $CIE_x$, 700–1000, 1800–2500 and 3200–4000 angstroms concerning $CIE_y$.

Figure 14:
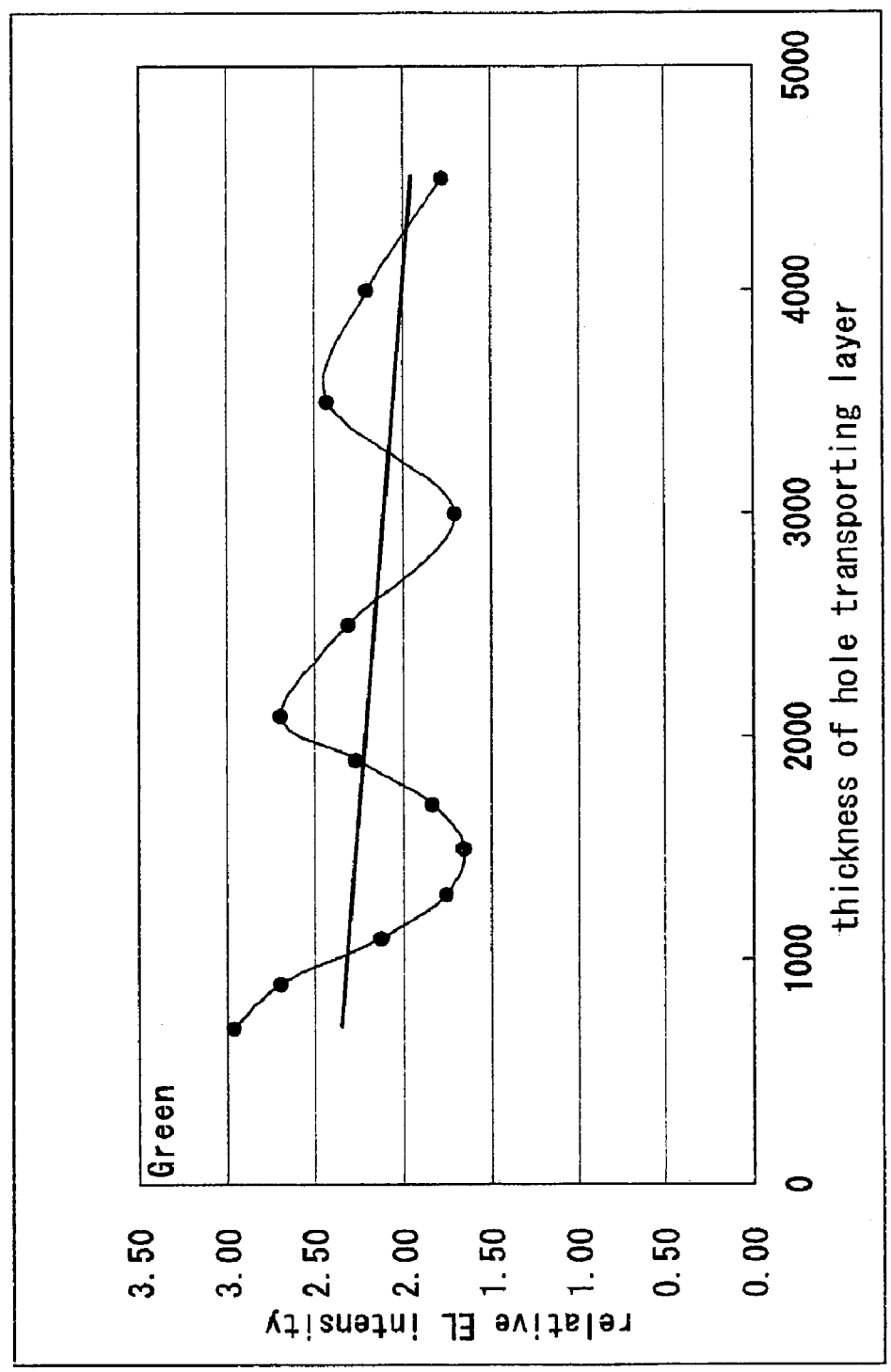
FIG. 14 is a graphic representation showing the relation between a relative intensity of a green light and a thickness of a hole transporting layer of an organic EL device.

FIG. 14 is a graphic representation showing the relation between a relative intensity of a green light and a thickness of a hole transporting layer 30 of an organic EL device. The curves show the thickness dependency of relative intensity of a green light, and the lines are least-square lines. As shown in FIG. 14, the ranges of the thickness where the intensity is higher than least-square lines are 700–1100, 1800–2600 and 3200–4300 angstroms.

Figure 15:
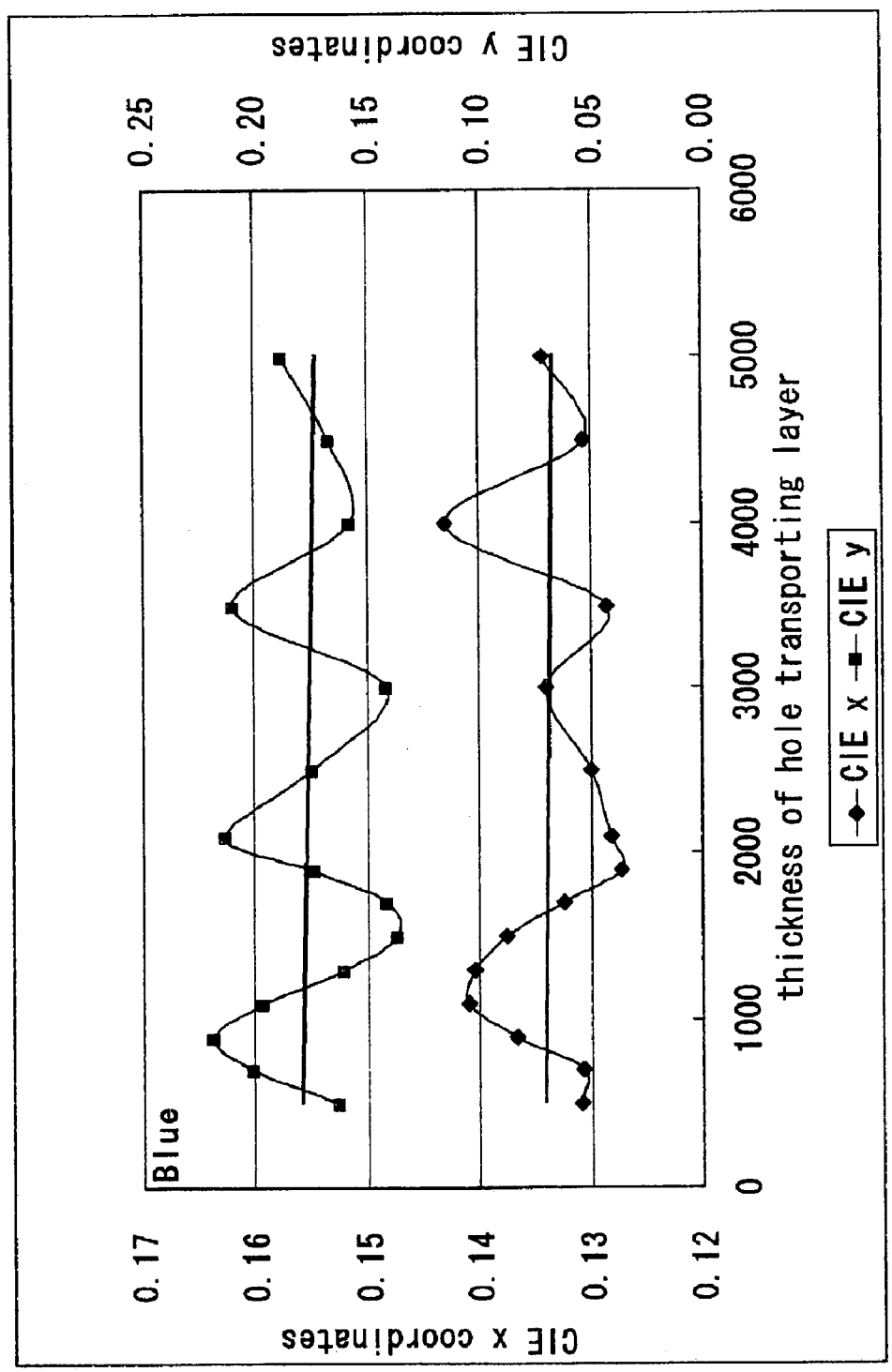
FIG. 15 is a graphic representation showing the relation between a blue chromaticity and a thickness of a hole transporting layer of an organic EL device.

FIG. 15 is a graphic representation showing the relation between a blue chromaticity and a thickness of a hole transporting layer 30 of an organic EL device. The curves show the thickness dependency of blue $CIE_x$ and $CIE_y$, and the lines are least-square lines. As shown in FIG. 15, the ranges of the thickness where the chromaticity is closer to the standard value than least-square lines are 800–1700, 2900–3100 and 3700–4300 angstroms concerning $CIE_x$, 1200–1900, 2500–3200 and 3800–4600 angstroms concerning $CIE_y$.

Figure 16:
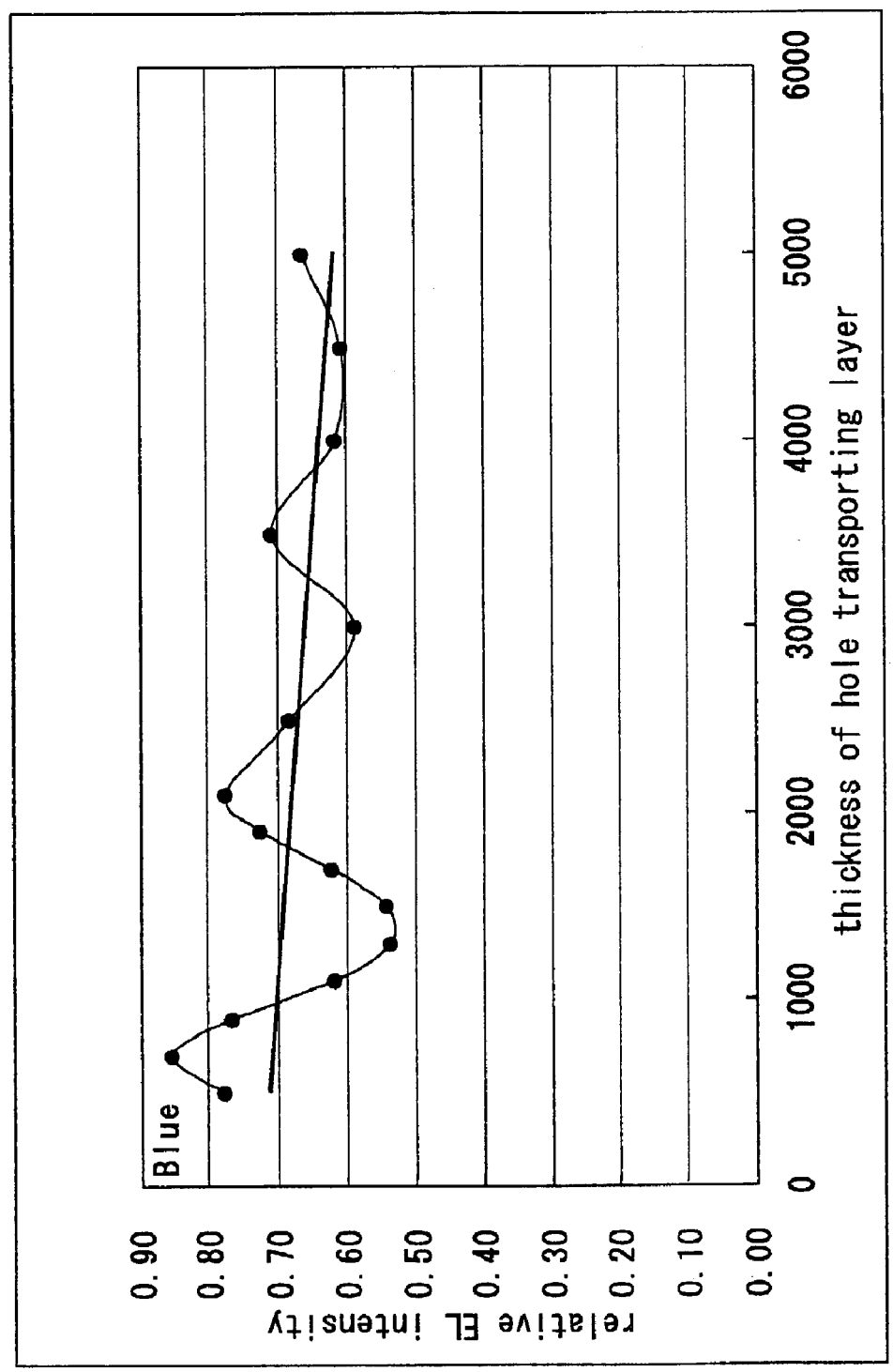
FIG. 16 is a graphic representation showing the relation between a relative intensity of a blue light and a thickness of a hole transporting layer of an organic EL device.

FIG. 16 is a graphic representation showing the relation between a relative intensity of a blue light and a thickness of a hole transporting layer of an organic EL device. The curves show the thickness dependency of relative intensity of a blue light, and the lines are least-square lines. As shown in FIG. 16, the ranges of the thickness where the intensity is higher than least-square lines are 500–1100, 1800–2600, 3200–3800 and 4800–5000 angstroms.

The thickness of the hole transporting layer 30 is not necessarily satisfy all of above mentioned conditions. The thickness of the hole transporting layer 30 may be determined making reference to above mentioned range of the thickness, considering materials of the hole transporting layer 30, the luminescent layer 40, or other organic layers, and so forth.

As mentioned above, the defect of the organic EL device such as poor luminescence across the entire pixel caused by the short, and poor luminescence around the foreign particle caused by poor evaporation of the organic luminescent element layer 80 can be effectively reduced according to the embodiments.

The present invention has been described based on embodiments which are only exemplary. It will be understood by those skilled in the art that there exist other various modifications to the combination of each component and process described above and that such modifications are encompassed by the scope of the present invention. Such modifications will be described hereinbelow.

In the foregoing embodiments, the organic luminescent element layer 80 includes the hole transporting layer 30, the luminescent layer 40, and the electron transporting layer 50. Nevertheless, the hole transporting layer 30 and the electron transporting layer 50 may be provided depending on the characteristics of the organic EL device. A plurality of hole transporting layers 30 or electron transporting layers 50 may also be provided. Regardless of the constitution of the organic luminescent element layer 80, any of the organic layers included in the organic luminescent element layer 80 may be thickened to cover foreign particles substantially. Here, the organic layer to cover foreign particles desirably has a thickness of 1300 angstroms or above, and preferably 1700 angstroms or above.

In the foregoing embodiments, the hole transporting layer 30 or the electron transporting layer 50 is increased in thickness. However, the luminescent layer 40 may be increased in thickness. Moreover, the individual organic layers included in the organic luminescent element layer 80 may be thickened in small amounts to achieve a desired thickness as a whole. Even in this case, the total thickness of the organic luminescent element layer 80 is desirably 1300 angstroms or above, and preferably 1700 angstroms or above. Consequently, foreign particles adhering to the surface of the substrate can be covered substantially to avoid an interelectrode short. The upper limit to the total thickness of the organic luminescent element layer 80 need only be designed not to have much effect on the characteristics of the organic EL device, with consideration given to the types of organic materials contained in the organic luminescent element layer 80. For example, it may be 5000 angstroms or less, and preferably 4000 angstroms or less.

Although the present invention has been described by way of exemplary embodiments, it should be understood that many changes and substitutions may further be made by those skilled in the art without departing from the scope of the present invention which is defined by the appended claims.

What is claimed is:

1. A method of manufacturing an organic electroluminescent device by depositing an organic layer on a substrate, wherein the organic layer includes a hole transporting layer provided between an anode layer and a luminescent layer provided on the substrate, the hole transporting layer is deposited so as to cover foreign particles adhering to the anode layer, the luminescent layer is deposited on the hole transporting layer, and the hole transporting layer includes N,N'-di(naphthalene-1-yl)-N,N,'-diphenyl-benzidine.

2. An organic electroluminescent device comprising a pair of electrode layers and an organic layer interposed between the pair of electrode layers, the organic layer including at least a luminescent layer, wherein the organic layer comprises:

an anode layer provided on a substrate;

a hole transporting layer including N,N'-di(naphthalene-1-yl)-N,N,'-diphenyl-benzidine and deposited so as to cover foreign particles adhered to the anode layer substantially; and the luminescent layer deposited on the hole transporting layer.

* * * * *